United States Patent [19]

Czaja

[11] 4,397,753
[45] Aug. 9, 1983

[54] SOLDER STRIPPING SOLUTION

[75] Inventor: James J. Czaja, Maple Plain, Minn.

[73] Assignee: Circuit Chemistry Corporation, Maple Plain, Minn.

[21] Appl. No.: 420,482

[22] Filed: Sep. 20, 1982

[51] Int. Cl.³ .............................................. C09K 13/08
[52] U.S. Cl. ....................................... 252/79.3; 134/3; 156/345; 156/656; 156/664; 252/79.4; 252/142
[58] Field of Search ...................... 134/3, 41; 156/656, 156/664, 345; 252/79.2, 79.3, 79.4, 142, 149; 75/97 R, 101 R

[56] References Cited

U.S. PATENT DOCUMENTS 3,677,949  7/1972  Brindisi et al. ...................... 252/79.4
4,004,956  1/1977  Brindisi ............................ 252/79.3 X
4,297,257 10/1981  Elias et al. ....................... 252/79.3 X
4,306,933 12/1981  DaFonte ........................... 252/79.4 X Primary Examiner—William A. Powell
Attorney, Agent, or Firm—Hugh D. Jaeger

[57] ABSTRACT

Solder stripping solution having an extended life for stripping and removing tin-lead alloy solder or tin deposits from entire circuits or tabs with an insignificant amount of attack on the base epoxy laminate or underlay copper or nickel substrate while leaving a residue-free substrate surface. This solution can be utilized at room temperature or preferably slightly above, and has a prolonged useful life of weeks to months. The composition of the solution includes a hydroxyphenol in an aqueous solution of a nitro-substituted aromatic compound, an inorganic acid, and thiourea.

16 Claims, 10 Drawing Figures

SMOBC PROCESS

COPPER ETCHING

SOLDER OR TIN STRIPPING

SELECTIVE SOLDER MASK APPLICATION

SOLDER LEVELING

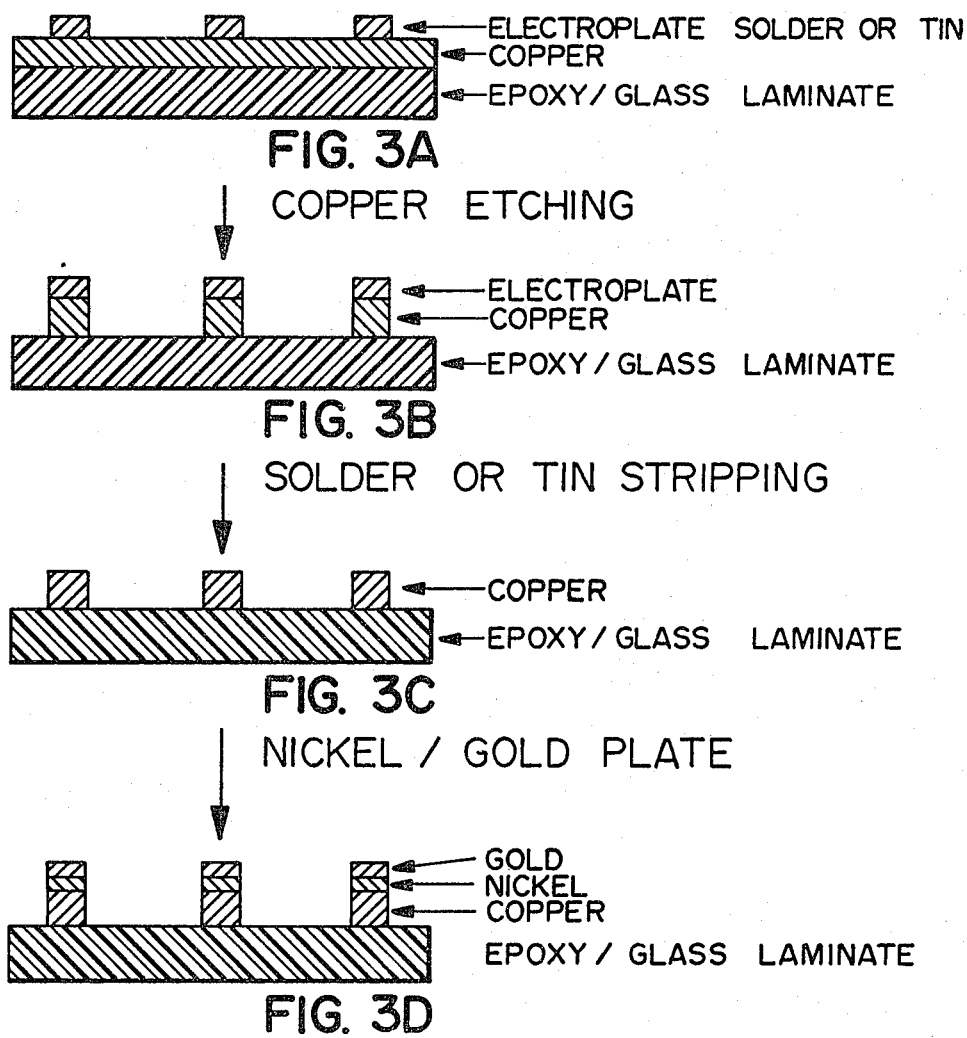

SOLDER STRIPPING SOLUTION

BACKGROUND OF THE INVENTION

1. Field of the Invention

The present invention pertains to a solder stripping or tin stripper solution for stripping tin and/or tin-lead alloy from a copper or nickel substrate and, more particularly, pertains to a solder stripper solution for solder-mask-over-bare copper (SMOBC) type boards or for subsequent nickel-gold tab plating on printed circuit boards, nickel and/or nickel alloys, and copper or copper alloys.

2. Background of the Invention

The prior art solder strippers are divided into two types, the first type containing peroxide and the second type which is non-peroxide.

The peroxide type of solder strippers all have the same basic chemistry of a fluoride and a peroxide. One of the major problems with the peroxide system is that the reaction is very exothermic in that heat builds up rapidly during the stripping action. While tab stripping is not a particular problem, the loading factor must be reduced or cooling coils installed when stripping SMOBC boards. The peroxide type of solder strippers darkens the solder at the demarcation line because the mode of solder removal is more of a grain boundary attack than a true dissolving of the solder. Because of this factor, the solder turns very black with a white powdery residue. The strippers measle the epoxy since there is an immediate attack on the epoxy undercoat and as the solution heats up, the attack becomes even more pronounced. The solutions leave an insoluble white residue which becomes progressively thicker as more stripping is undertaken. Although the residue wipes off, it cannot be removed from holes or line overhang without a secondary treatment. Ventilation is always required in that the peroxide out-gasses from the solution emitting a mist of fluoride. As the solution exotherms, the out-gassing becomes more severe. Although the solutions have copper inhibitors, there is still a fair amount of copper attack. The rate of attack rises almost exponentially as the solution heats up. If boards with large areas to be stripped are put close together, the solution trapped between the boards can easily reach 135°–150° F., even though the main body may be at 85° F. This trapped high temperature solution can lead to isolated, excessive copper attack which the stripper is unaware of.

The non-peroxide types have a more diverse chemistry than the peroxide type of solder stripper although most of the non-peroxide types utilize an inorganic acid. The non-peroxide strippers have definite advantages over the peroxide type strippers in that the non-peroxide strippers do not measle the epoxy, have controllable stripper rates and are only slightly exothermic, and truly dissolve the solder without simply undercutting the solder.

The present invention overcomes the disadvantages of the prior art by providing a non-peroxide stripper which is a one component system, clear and easily visible while stripping, and does not attack the solder, especially at the demarcation line and has an extended life span after the introduction of tin or solder alloy of weeks to months.

In one approach to overcoming the noted disadvantages of the prior art, U.S. Pat. No. 3,677,949 discloses a solder stripping composition consisting of a nitro-substituted aromatic compound, an inorganic acid selected from the group of fluoboric acid, fluosilicic acid, or sulfamic acid and thiourea. Additional additives were organic acid accelerators and wetting agents. This formulation has suffered since the useful life span is measured in hours after the introduction of tin or alloy thereof into the solution and there is a white powdery residual left on the surface of the base metal after stripping of the solder which required either scrubbing away or removal by a secondary solution. This patent is particularly ineffective for stripping tin or tin alloy thereof.

The present invention overcomes the disadvantages of the prior art by providing a non-peroxide solder stripping solution which is a one-component system, clear and visible with a straw-yellow color during stripping, does not attack the substrate or epoxy board, especially at the demarcation line, and has long shelf life.

SUMMARY OF THE INVENTION

The general purpose of the present invention is to provide a non-peroxide solder or tin stripping solution which is clear and easily viewable, is a one-component system, has long shelf life, does not attack the substrate, also does not attack the substrate at the solder demarcation line, provides a stripped copper which appears pink and bright and can be easily activated for subsequent operation, and which does not leave residue on the board.

According to one embodiment of the present invention, there is provided a solder stripping solution of nitro-substituted aromatic compound, an inorganic acid, a thiourea, and a hydroxyphenol in the aqueous solution.

According to another embodiment of the present invention, there is provided solder stripping non-peroxide solution for stripping tin/lead alloy from circuit boards particularly solder-mask-over-bare copper type circuit boards, the solution including an aqueous solution of a nitro-substituted aromatic compound, fluoboric acid, boric acid, a hydroxyphenol, ammonium nitrate, nitric acid and thiourea where solder or tin is dissolved through chemical reaction from copper or nickel laminated on the epoxy boards, thereby leaving substrate metal which is oxide free and bright for activation and subsequent operation.

One significant advantage of the non-peroxide solder stripping solution is that the solder attack mode does not leave the solder black at the demarcation line. The copper appears pink and bright after stripping and can be easily activated for subsequent operation.

Another significant aspect and feature of the present invention is a solder stripping solution which is clear and provides for visible viewing during the stripping. The solution is a straw color, that is, a yellow color. After stripping, no residue remains at the bottom of the solution until the stripping solution is near exhaustion.

A further significant aspect and feature of the present invention is a solder stripping solution which will strip approximately one-third more tin/lead for the same quantity of the prior art solutions.

An additional significant aspect and feature of the present invention is that the solder stripping solution provides more yield per like quantity with respect to the prior art. While the solder stripping solution is slightly more expensive in cost, the yield makes up the difference. The solder stripping solution will also strip reflowed parts although at a slightly slower rate than that on unreflowed parts.

Having thus described one embodiment of the present invention, it is a principal object hereof to provide a solder stripping solution. The solution also strips tin.

One object of the present invention is to provide a solder stripping solution which is particularly useful with solder-mask-over-bare copper (SMOBC) type boards where there are large surfaces to be stripped.

Another object of the present invention is a solder stripping solution which is clear and provides for visibility during the stripping process, and leaves the copper pink and bright for activation and subsequent operation. Also, the stripper solution leaves no residue on the circuit boards.

A further object of the present invention is in the manufacture of printed circuit boards where removal of lead-tin solder alloy or tin is a necessary step in the manufacture of the boards. Another area of use would be in the removal of defective coatings of tin or solder on electrical components, these components being sensitive to contact with a fluorine containing chemical such as those containing fluoride or fluoborate based compounds. In such instances, the formulation of the solution of the present invention would not include the use of a fluoborate containing compound.

An additional object of the present invention is the solution of the nitro-substituted aromatic compound, an inorganic acid, a thiourea, and a hydroxyphenol which has a stripping life of weeks to months. The composition for stripping lead-tin alloy solder and tin from a copper or nickel substrate includes an extended life and residue-free substrate surface as provided by the inclusion of a hydroxyphenol in an aqueous solution of a nitro-substituted aromatic compound, an inorganic acid and thiourea. The hydroxyphenol and/or derivatives thereof negate the life shortening effect once tin is introduced into the solution.

Still another object of the present invention is for use where the application of gold or nickel, or a combination of both, is applied to tab areas of the printed circuit board.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and where.

DESCRIPTION OF PREFERRED EMBODIMENTS

Figure 1:
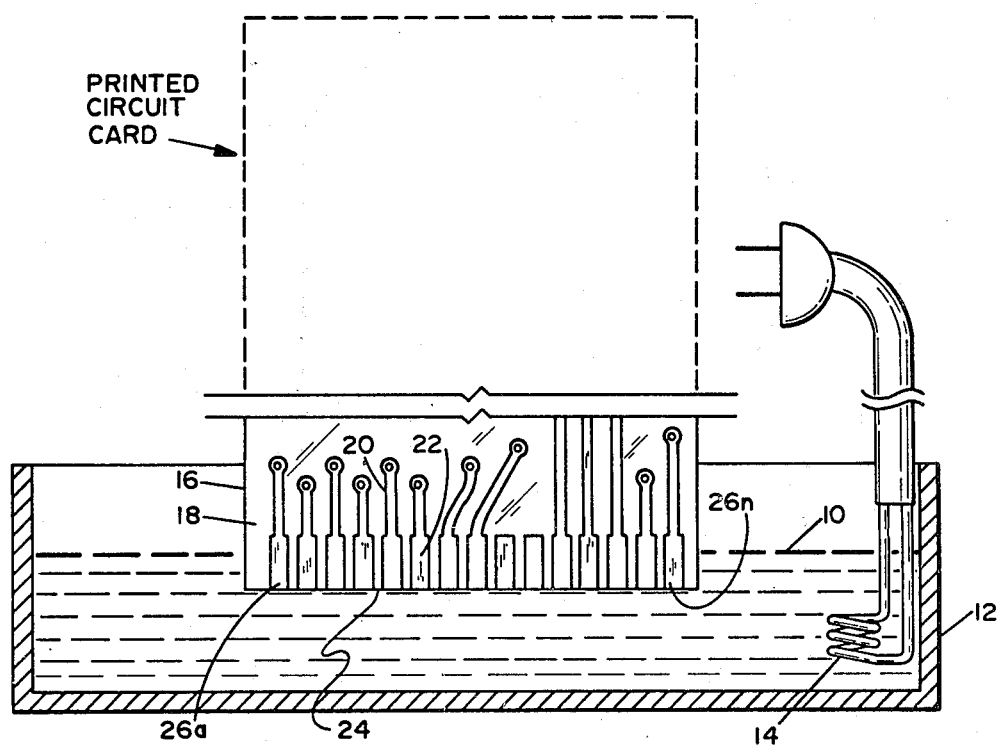
FIG. 1 is an operational view of the solder stripping solution.

The components of the non-peroxide stripping solution of the present invention per liter of water includes the following components in proportions in the following ranges per liter of water for an aqueous solution including:

| | |
|---|---|
| nitro-substituted aromatic compound | 20-150 g/l |
| fluoborate compound | 0.1-300 g/l |
| 3-hydroxyphenol | 0.1-50 g/l |
| an ammonium compound | 0.1-300 g/l |
| ammonium nitrate | 0.1-150 g/l |
| inorganic acid | 0.1-400 g/l |
| thiourea | 0.1-30 g/l |
| boric acid | 2-60 g/l |

The solution provides an extended life span for stripping of solder alloys or tin from base metals of copper, nickel or copper alloys including substrates of printed circuit boards.

Sodium meta-nitrobenzene sulfonate is the preferred aromatic nitro compound, but any other water soluble nitro-substituted aromatic compound is suitable. By example for illustrations only but not limiting, o, m, and p-nitrochlorobenzenes; o, m, and p-nitrobenzene sulfonic acids; and o, m, and p-nitrobenzoic acids and mixtures thereof are suitable. The preferred nitro-substituted aromatic compound used is sodium meta-nitrobenzenesulfonate.

The use of nitric acid as the inorganic acid accelerates the reaction speed such that it doubles the stripping rate of previously known stripping compositions of similar formulations. The white residue of tin or lead salts left on the base metal surface is also removed by using nitric acid. Additionally, the use of nitric acid instead of fluoboric, fluosilicic, or sulfamic greatly increases the stripping rate of the solution, but more importantly removes the white residue left on the copper surface if nitric acid is not used. Nitric acid is the preferred inorganic acid, but other acid such as fluoboric, fluosilicic, or sulfamic are suitable if the white residue left by using these acids alone is removed by a secondary solution. As is known by those familiar with fluoborate chemistry, boric acid should be present with fluoborate ion so as to negate the effect of free fluoride if the fluoborate ion disassociates.

Ammonium fluoborate is the preferred source of ammonium and fluoborate ion. Other suitable sources are common ammonium compounds such as ammonium nitrate, ammonium acetate, ammonium halides, or ammonium hydroxide and sodium fluoborate, potassium fluoborate, or fluoboric acid. Additionally, the introduction of ammonium ion causes the lead-tin alloy solder or tin being attacked to remain in a white and unoxidized condition making it possible for only partial removal of such deposits. Heretofore this partial removal and subsequent reactivation has not been possible. The addition of ammonium ion as ammonium fluoborate also has the added benefit of increasing the amount of lead and tin that can be dissolved before precipitation occurs.

Thiourea per se is the preferred thiourea, but other alkyl and aromatic thioureas are also suitable.

The presence of 3-hydroxyphenol stops the adverse effect of organo-tin compounds causing premature stoppage of a useful stripping action thereby extending the life of such a stripping solution to be measured in weeks/months instead of hours. 3-hydroxyphenol is the preferred hydroxyphenol but other hydroxyphenols and/or their derivatives are suitable for use therein as so determined.

A preferred composition of the components for the solution 10 includes in an aqueous solution to one liter of water the following:

| | |
|---|---|
| sodium m-nitrobenzene sulfonate | 80 g/l |
| fluoboric acid - 48% | 276 g/l |
| boric acid | 8 g/l |
| 3-hydroxyphenol | 8 g/l |
| ammonium nitrate | 36 g/l |
| nitric acid - 42°Be | 90 ml/l |
| thiourea | 14 g/l |
| water | to one liter |

Mode of Operation

The solder stripping non-peroxide solution of the present invention is utilized to strip tin, or tin/lead alloys for the like solder deposits from a copper substrate such as that laminated on a printed circuit board or from any like surface particularly, the non-peroxide tin/lead solder removing solution is oriented towards solder-mask-over-bare copper (SMOBC) printed circuit type boards or for subsequent nickel-gold tab stripping. In mass production, the solution can be either sprayed onto the particular segment of the printed circuit or, in the alternative, the end of the board can be dipped into a solution such as that illustrated in the drawing. The solution strips the tin/lead alloy from the tabs of the printed circuit board until the copper shows as a pink bright metal. There is no attack on the copper itself. The non-peroxide solder stripping solution particularly lends itself to spraying as opposed to a dipping procedure. Upon the room temperature, the solution is recommended for use at 85° F. Heating can be accomplished with a 316 stainless steel or teflon type heater and the solution can be utilized in a PVC, polyethylene or polypropylene container. The shelf life of the solution is anticipated to be six months when stored at room temperature in a cool dry area. Inherently, standard safety equipment is utilized as the solution contains acids as well as oxidizers. The appearance of the solution is a straw yellow color with little or no odor.

The yield of the non-peroxide solder stripping solution will dissolve 18-22 ounces per gallon of solder from a 0.0008 inch of tin/lead in approximately 90 seconds. The load factor can be up to one foot squared/gallon.

FIG. 1 illustrates a non-peroxide solder stripping solution in a suitable container 12 such as PVC, polyethylene or polypropylene 12. A heater 14 such as a 316 stainless steel or teflon type heater or the like is utilized. A printed circuit board 16 having a dielectric substrate 18 such as G-10 glass epoxy or the like includes an etched copper foil 20 thereon having a tin/lead solder plate coating 22. The one end of the board 24 includes a plurality of circuit traces or tabs 26 which connect to the copper foil circuit.

While the solution lends itself to a dipping operation, the solution also lends itself just as well to a spraying operation. The solution is clear and the work of stripping is easily visible to the naked eye. The solution does not leave the solder black at the demarcation line and provides that on stripping the copper appears pink and bright for the subsequent operation. No residue remains and is particularly useful in the stripping of plated-through holes. Most importantly, there are no offensive odors given off during the stripping process of the SMOBC. The stripper will dissolve 18-22 ounces per gallon of solder over a 0.0008 inch of tin/lead in approximately 90 seconds with a load factor up to one foot squared per gallon. This is at slightly above room temperature at 85° F., but for reflowed solder a temperature range of 95°-100° F. is suggested. Lower temperatures will result in a corresponding drop in strip rate. The particular advantage is that there is no significant attack on the base epoxy laminate or the underlying copper no matter what length of immersion is undertaken. More importantly, the light powdery residue typically left on the surface of the copper underlay by the prior art peroxide or non-peroxide type strippers is not present and is absent from the non-peroxide solder stripper solution 10.

Figure 2A:
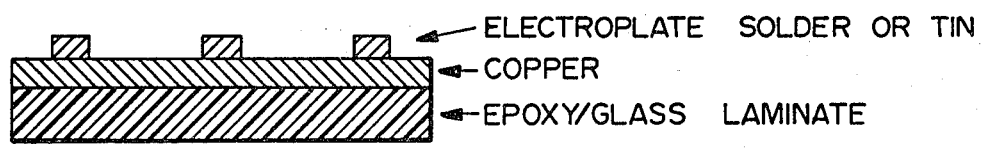
FIGS. 2A-2E is an operational view of steps of a SMOBC board having been stripped of solder or tin in the stripper solution and the subsequent application of a solder mask in selected areas; and, FIGS. 3A-3D is an operational view of steps of a printed circuit board and the process necessary for applying the nickel-gold coating in the tab areas.
Figure 2B:
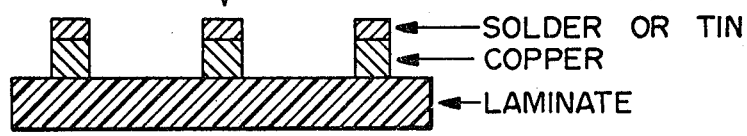
Figure 2C:
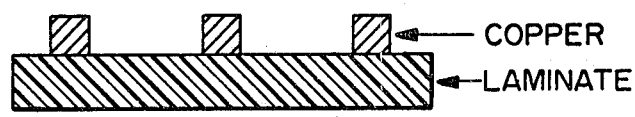
Figure 2D:
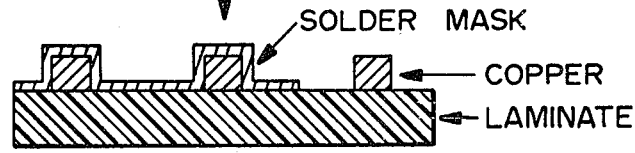
Figure 2E:
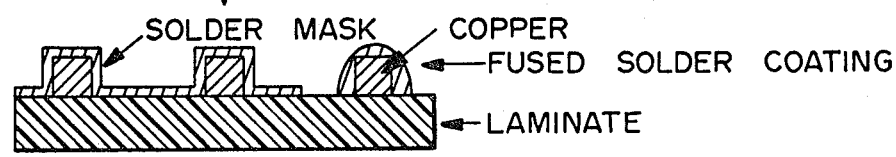

FIGS. 2A-2E is an operational view of steps of a SMOBC process stripped of solder or tin in the stripper solution. FIG. 2A shows the board prior to stripper and FIG. 2B shows the copper etching. FIG. 2C shows the solution performing solder or tin stripping. FIG. 2D shows the selective solder mark application in selected areas. FIG. 2E shows the areas where the solder mask is not applied and where the areas are then covered with a layer of molten solder in a solder leveling application step. The solution 10 of the present invention strips in FIG. 2C.

FIGS. 3A-3D is an operational view of steps of using the solder stripping solution on a printed circuit board and the process necessary for applying a nickel-gold coating to the tabs. FIG. 3A shows the PC board, FIG. 3B shows the copper etching, FIG. 3C shows the stripping of solder or tin, and FIG. 3D shows the nickel or gold plating.

SPECIFIC EXAMPLES

Example 1

A 500 ml stripping solution is prepared by adding sodium m-nitrobenzenesulfonate, fluoboric acid, and thiourea to water, the components being added in an amount to provide the following concentrations:

| | |
|---|---|
| sod. m-nitrobenzenesulfonate | 80 g/l |
| 48% fluoboric acid | 276 g/l |
| thiourea | 16 g/l |

The resulting solution is divided into two 250 ml portions. The first of these portions, Solution A, is composed of the above formulation. Solution B contains an added amount of 8 g/l 3-hydroxyphenol. To both solutions three pieces of 1"×5"×0.062" copper clad laminate which has been plated with a thickness of 0.0007" of solder alloy are immersed. Both Solutions A and B stripped the solder from the copper clad laminate in approximately three minutes leaving only a light white residue. After two hours, three more pieces of solder plated copper clad laminate were immersed. The solder on the pieces immersed in Solution A turned a very deep black-yellow color with the solder only being somewhat removed after 15 minutes. the pieces immersed in Solution B stripped in approximately three minutes with only the same light white residue being left on the surface of the copper, this residue being easily wiped off.

Solutions A and B were covered and twelve days later more solder plated samples were immersed. The results were exactly the same as described as for two hours after the introduction of solder alloy into the solution.

EXAMPLE 2

A 1000 ml stripping solution is prepared by adding sodium m-nitrobenzenesulfonate, fluoboric acid and thiourea to water, the components being added in an amount to provide the following concentrations:

| | |
|---|---|
| sod. m-nitrobenzenesulfonate | 80 g/l |
| 48% fluoboric acid | 276 g/l |
| thiourea | 16 g/l |

The resulting solution is divided into four 250 ml portions. Solution C is composed of the above formulations with an added 32 ml/l of a 492 g/l solution of a lead fluoborate concentrate. Solution D is composed of the above formulation with an added 50 ml/l of a 328 g/l stannous fluoborate concentrate. Solution E is composed of the above formulation with an added 8 g/l of 3-hydroxyphenol and 32 ml/l of a lead fluoborate concentrate. Solution F is composed of the above formulation with an added 8 g/l of 3-hydroxyphenol and 50 ml/l of a 328 g/l stannous flouborate concentrate.

The four portions, after mixing were allowed to sit for two hours. After two hours a 1"×5"×0.062" piece of solder plated to a thickness of 0.0007" copper clad laminate was immersed.

Those samples immersed in Solutions C, E and F were stripped of their solder coating in approximately three minutes with only a light white residue left on the surface. The solder on the sample immersed in Solution D turned a very deep black-yellow color with the solder only being somewhat removed after 15 minutes.

EXAMPLE 3

A 500 ml stripping solution is prepared by adding sodium m-nitrobenzenesulfonate, fluoboric acid, thiourea, and 3-hydroxyphenol to water, the components being added in an amount to provide the following concentrations:

| | |
|---|---|
| sodium m-nitrobenzenesulfonate | 80 g/l |
| 48% fluoboric acid | 276 g/l |
| thiourea | 16 g/l |
| 3-hydroxyphenol | 8 g/l |

The resulting solution is divided into two 250 ml portions. The first of these portions, Solution G, is composed of the above formulation. Solution H contains an added 9 percent of a concentrated nitric acid.

To both solutions, three pieces of a 1"×5" copper clad laminate which was solder plated to a thickness of 0.0007" was immersed. The pieces immersed in Solution G were solder stripped in approximately three minutes with only a light white residue being left on the copper surface.

The pieces immersed in Solution H were solder stripped in 1½ minutes with no evidence of a residue of any kind left on the copper surface.

EXAMPLE 4

A 300 ml stripping solution is prepared by adding sodium m-nitrobenzenesulfonate, thiourea, nitric acid, and 3-hydroxyphenol to water, the components being added in an amount to provide the following concentrations:

| | |
|---|---|
| sodium m-nitrobenzenesulfonate | 80 g/l |
| thiourea | 16 g/l |
| nitric acid, concentrated | 11% by vol. |
| 3-hydroxyphenol | 8 g/l |

The resulting solution is divided into two 150 ml portions.

The first of these portions, Solution J, is composed of the above formulation. Solution K contains an additional 150 g/l of ammonium fluoborate.

To both solutions three pieces of 1"×5"×0.062" copper clad laminate which have been solder plated to a thickness of 0.0007" are immersed. The samples immersed in Solution J have their solder removed in approximately 1½ minutes with a definite dark discoloration to the solder surface as it dissolves. The samples immersed in Solution K have their solder removed in approximately 1½ minutes with the solder having a definite white and oxide free condition to the surface.

Additional pieces of the 1"×5"×0.062" solder plated laminate were immersed in Solutions J and K. A definite precipitation was noticed in Solution J after eight additional pieces were stripped. No precipitation was noticed in Solution K until 14 pieces of laminate had their solder stripped.

EXAMPLE 5

A 300 ml stripping solution is prepared by adding sodium m-nitrobenzenesulfonate, nitric acid and thiourea to water, the components being added in an amount to provide the following concentrations:

| | |
|---|---|
| sodium m-nitrobenzenesulfonate | 80 g/l |
| thiourea | 16 g/l |
| 48% fluoboric acid | 276 g/l |

The resulting solution is divided into two 150 ml portions. The first of these portions, Solution L, is composed of the above formulations. Solution M contains an added amount of 8 g/l 3-hydroxyphenol.

To both solutions three pieces of 1"×5"×0.062" copper clad laminate which has been plated with a thickness of 0.0005" of tin are immersed. Both Solutions L and M stripped the tin from the copper clad laminate in approximately 5 minutes leaving only a light white residue. After three hours, three more pieces of tin plated copper clad laminate were immersed in both solutions. The tin on the pieces immersed in Solution L turned a deep gray-yellow color with the tin not completely removed after 20 minutes. The tin on the pieces immersed in Solution M stripped in approximately 5 minutes leaving only a light white residue.

Having thus described the invention, what is claimed is:

1. Solution for the removal of tin or tin-lead alloy solder from a copper or nickel base, said solution comprising:
   (a) 20–150 g/l of a m-nitro substituted aromatic compound;
   (b) 0.5–10 g/l of a thiourea selected from a group of thiourea per se, an alkyl thiourea or an aromatic thiourea;
   (c) 0.1–50 percent by volume of an inorganic acid selected from a group including fluoboric acid, fluosilicic acid, sulfamic acid, or nitric acid; and, (d) 0.1–50.0 g/l of a hydroxyphenol providing extended life to the stripping solution.

2. Solution of claim 1 where the inorganic acid is nitric acid.

3. Solution of claim 1 which also contains an ammonium ion of the formulation $NH_4X$ in the range of 0.1–300 g/l, X being an ion consisting of either nitrate, fluoborate, acetate, halogen, or hydroxide.

4. Solution of claim 1 which also contains a fluoborate ion of the formulation $RBF_4$ in the range of 0.1–750 g/l, R being a cation consisting of either a hydrogen, ammonium, sodium or potassium ion.

5. Non-peroxide solder stripper solution comprising:
   (a) nitro-substituted aromatic compound of 20–150 g/l;
   (b) fluoborate compound of 0.1–750 g/l;
   (c) hydroxyphenol of 0.1–50 g/l;
   (d) ammonium compound of 0.1–300 g/l;
   (e) inorganic acid of 0.1–400 g/l;
   (f) thiourea of 0.1–30 g/l;
   (g) boric acid of 2–60 g/l; and
   (h) water to one liter.

6. Solution of claim 5 wherein said nitro-substituted aromatic compound is selected from o, m, or p-nitrochlorobenzenes, o, m, or p-nitrobenzenes, sulfonic acids, and o, m, or p-nitrobenzonic acids.

7. Solution of claim 6 comprising sodium meta-nitrobenzenesulfonate.

8. Solution of claim 5 wherein said ammonium compound is selected from ammonium nitrate, ammonium halides, ammonium acetate, or ammonium hydroxide in combination with sodium fluoborate, potassium fluoborate, or fluoboric acid.

9. Solution of claim 8 comprising ammonium fluoborate.

10. Solution of claim 5 wherein said inorganic acid is selected from fluoboric, fluosilic, sulfamic, or nitric acid.

11. Solution of claim 10 comprising nitric acid.

12. Solution of claim 5 wherein said hydroxyphenol comprises 3-hydroxyphenol.

13. Solution of claim 5 wherein said thiourea is selected from alkyl and aromatic thiourea.

14. Non-peroxide solder stripping solution comprising:
   (a) sodium m-nitrobenzenesulfonate of 80 g/l;
   (b) fluoboric acid of 276 g/l;
   (c) boric acid of 8 g/l;
   (d) 3-hydroxyphenol of 8 g/l;
   (e) ammonium nitrate of 36 g/l;
   (f) nitric acid of 90 ml/l;
   (g) thiourea of 14 g/l;
   (h) to one liter of water.

15. Solution of claim 14 for stripping solder or tin in an SMOBC process.

16. Solution of claim 14 for stripping solder or tin from printed circuit boards in a nickel-gold process.

* * * * *